(12) United States Patent
Goto (10) Patent No.: US 7,332,694 B2
(45) Date of Patent: Feb. 19, 2008

(54) HEATING RESISTANCES AND HEATERS (75) Inventor: Yoshinobu Goto, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/024,244

(22) Filed: Dec. 28, 2004

(65) Prior Publication Data
US 2005/0173411 A1    Aug. 11, 2005

(30) Foreign Application Priority Data
Jan. 7, 2004    (JP)    ............... P2004-001725

(51) Int. Cl.
H05B 3/18    (2006.01)
H05B 3/68    (2006.01)
H01C 3/08    (2006.01)

(52) U.S. Cl. ............... 219/543; 219/444.1; 219/468.1; 338/296; 338/297; 338/217; 338/218

(58) Field of Classification Search ............... 219/543, 219/270, 236, 552, 444.1, 465.1, 466.1; 338/296, 338/297, 307–309, 218, 217; 392/438, 439
See application file for complete search history.

(56) References Cited

U.S. PATENT DOCUMENTS

| | | | | |
|---|---|---|---|---|
| 4,034,207 A | * | 7/1977 | Tamada et al. | 219/517 |
| 4,892,998 A | * | 1/1990 | Marstiller et al. | 219/548 |
| 4,912,306 A | * | 3/1990 | Grise et al. | 219/549 |
| 5,019,797 A | * | 5/1991 | Marstiller et al. | 338/333 |
| 5,393,958 A | * | 2/1995 | Gross et al. | 219/461.1 |
| 5,403,993 A | * | 4/1995 | Cordia et al. | 219/549 |
| 5,512,731 A | * | 4/1996 | McWilliams | 219/461.1 |
| 6,184,502 B1 | * | 2/2001 | Haazendonk | 219/460.1 |
| 6,660,977 B2 | * | 12/2003 | Chen | 219/543 |
| 2003/0173354 A1 | * | 9/2003 | Chen | 219/543 |
| 2003/0209534 A1 | * | 11/2003 | Ferguson | 219/548 |
| 2004/0112888 A1 | * | 6/2004 | Tachikawa et al. | 219/468.1 |

FOREIGN PATENT DOCUMENTS

| | | | |
|---|---|---|---|
| EP | 637194 A1 | * | 2/1995 |
| JP | 05144550 A | * | 6/1993 |
| JP | 2003-272805 A | | 9/2003 |
| JP | 2001-102157 A | | 4/2004 |

* cited by examiner

Primary Examiner—Tu Ba Hoang
Assistant Examiner—Stephen J. Ralis
(74) Attorney, Agent, or Firm—Burr & Brown (57) ABSTRACT A heating resistance 1 comprises a shaped body of a band made of a conductive material obtained by bending the band in a shape of a wave. The heating resistance 1 is fixed to a substrate made of an insulating material to obtain a heater. Alternatively, the heating resistance comprises a wound body of a band made of a conductive material. According to the present invention, the heating value per a unit length can be easily designed and changed, and the reliability can be improved and abnormal heat generation can be prevented at the interface where the heating value per a unit length is changed.

3 Claims, 11 Drawing Sheets

Appendix C

Fig. 7

Appendix C

HEATING RESISTANCES AND HEATERS

This application claims the benefits of Japanese Patent Application P2004-1725 filed on Jan. 7, 2004, the entirety of which is incorporated by reference.

BACKGROUND OF THE INVENTION

1. Field of the Invention

The invention relates to a heating resistance and heater suitable to, for example, for heating semiconductors, whose temperature distribution can be easily controlled.

2. Related Art Statement

In semiconductor producing systems, ceramic heaters have been applied for heating a wafer so as to deposit a semiconductor thin film on the wafer from gaseous raw materials such as silane gas by means of thermal CVD or the like. In such ceramic heaters, it is required to make the temperature of the heating face and the semiconductor wafer mounted thereon uniform at a high precision.

Several techniques for reducing the temperature distribution on the heating (mounting) face of the ceramic heater are known. For example, a so-called two-zone heater is such a heater. Such a two-zone heater has a ceramic substrate and inner and outer resistance heat generators embedded in the substrate. Separate power supply terminals are connected to the respective heat generators so that electric power may be applied independently to the respective heat generators. Heat generated from the inner and outer heat generators may thus be independently controlled.

Two-zone heaters include the following types. Japanese patent publication 2001-102157A discloses a heater having a ceramic substrate and two layers of heating elements embedded in the substrate. The calorific values in the inner zone and outer zone of each heating element are controlled so that a two-zone control system of inner and outer zones is realized.

It is desired to provide a design for adjusting the heat generation density from a heating resistance embedded in a ceramic heater, depending on the actual environmental conditions where the heater is set. For example, when a heating resistance (wound body) having a coil spring shape is embedded in a ceramic substrate, the heat generation density per unit area can be raised by increasing the winding number or winding diameter (coil diameter) or by reducing the wire diameter. Further, the heat generation density per unit area can be lowered by reducing the winding number or winding diameter (coil diameter) or by increasing the wire diameter.

Normally, the material of a heating resistance embedded in a ceramic substrate should be a high melting point metal which does not melt or easily deform at the sintering temperature of ceramics, and thus is limited. For example, when a wound body of molybdenum wire or tungsten wire is used, it is difficult to change the winding diameter or wire diameter in a single wound body due to the limitations of the manufacturing process. It is thus necessary that a plurality of wound bodies having the different winding diameters, winding numbers or wire diameters are joined and electrically connected with each other before the connected wound bodies are embedded in a ceramic substrate.

According to Japanese Patent publication 2003-272, 805A, for example, when a heating resistance composed of a tungsten coil is embedded in a ceramic substrate, two kinds of heating resistances having different wire diameters and winding diameters are used and are mechanically connected with each other using a spherical connecting terminal. It is thus possible to embed and combine two or more kinds of heating resistances having different wire diameters or winding diameters in a single ceramic substrate so that hot and cold spots on the surface of the substrate can be reduced.

The material of a heating resistance embedded in a ceramic substrate is, for example, a high melting point metal such as tungsten or molybdenum. A wire made of such high melting point metal is hard, brittle, hard to deform and is thus difficult to process. The terminal described above is thus necessary for connecting a plurality of heating resistances having the different wire diameters. However, if the resistance at the connecting part of the heating resistance and the terminal in use is raised, hot spots may be observed on the heating face. Moreover, for assuring excellent mechanical strength and reliability of the connecting parts of the heating resistance and the terminal, the structure, shape and method of connecting the connecting part need to be studied in detail. The manufacturing process required for producing the connecting part may become troublesome.

SUMMARY OF THE INVENTION

An object of the present invention is, in a heating resistance, to make the design and change of the heating value per unit length easier, and to improve the reliability and prevent abnormal heat generation at interfaces where the heating value per unit length is changed.

A first aspect of the present invention provides a heating resistance comprising a shaped body of a band made of a conductive material and having a shape of a wave. The first aspect of the present invention further provides a heater comprising a substrate made of an insulating material and the above heating resistance fixed to the substrate.

Figure 1:
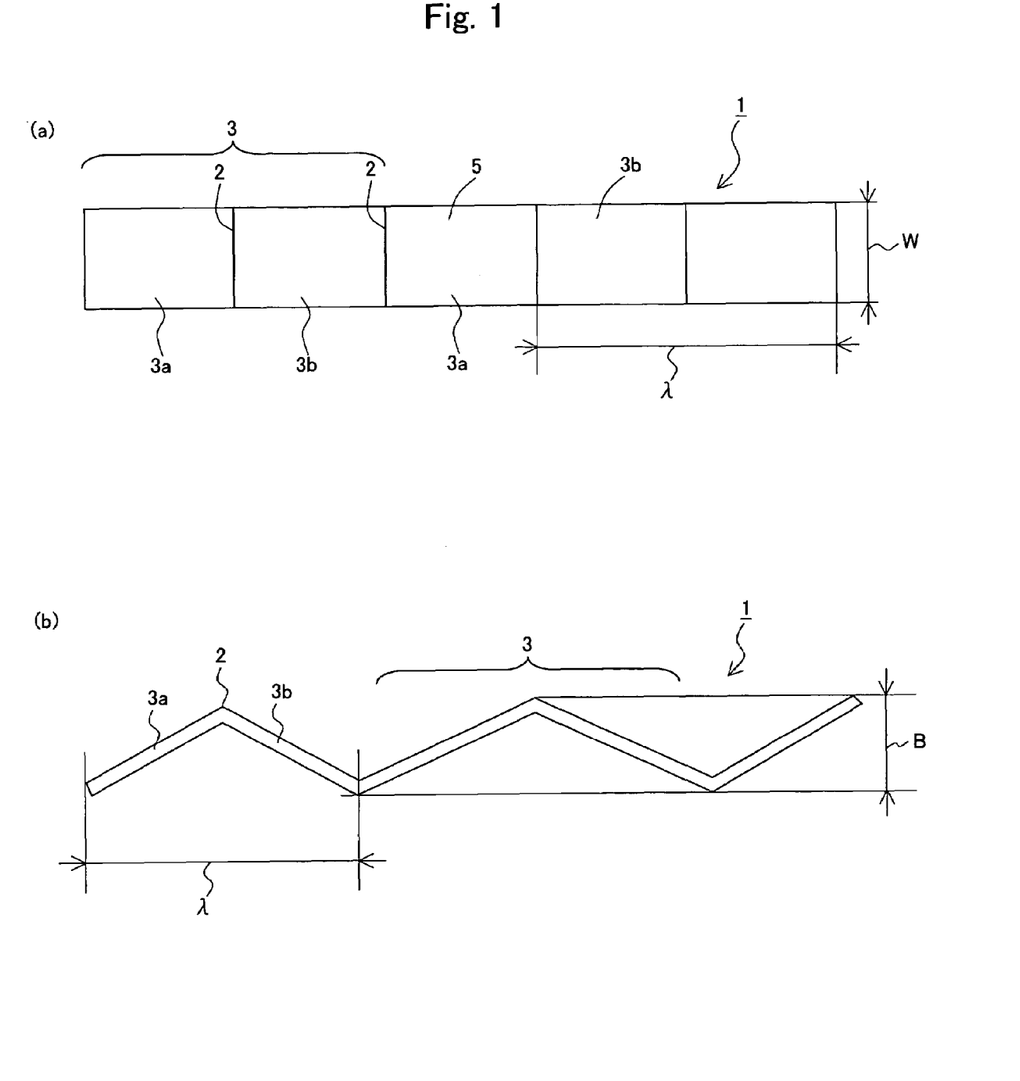

According to the first aspect, it is necessary that the shaped body has a shape of a wave in a front view as shown in FIGS. 1 (*b*), 2 (*b*) or 9 (*b*). The wave shape is not particularly limited as far as the shaped body has repetition units each composed of wall parts in a front view. The wave shape may be a sinewave, rectangular wave or any other wave pattern.

A second aspect of the present invention provides a heating resistance comprising a wound body of a band of conductive material. The second aspect of the present invention further provides a heater comprising a substrate made of an insulating material and the above heating resistance fixed to the substrate.

These and other objects, features and advantages of the invention will be appreciated upon reading the following description of the invention when taken in conjunction with the attached drawings, with the understanding that some modifications, variations and changes of the same could be made by the skilled person in the art.

BRIEF DESCRIPTION OF THE DRAWINGS

FIG. 1 (*a*) is a plan view showing a heating resistance 1 according to the first aspect of the present invention.

FIG. 1(*b*) is a front view showing the heating resistance 1.

FIG. 2(*a*) is a plan view showing a heating resistance 1A according to the first aspect of the present invention.

FIG. 2(*b*) is a front view showing the heating resistance 1A.

FIG. 4(*a*) is a diagram schematically showing the planar pattern of the heating resistance 1 embedded in the substrate 9.

FIG. 4(b) is a diagram schematically showing the planar pattern of the heating resistance embedded in the substrate 9.

DETAILED DESCRIPTION OF THE INVENTION

The advantageous effects of the present invention will be described below referring to FIGS. 1 and 2. FIG. 1 (a) is a plan view showing a heating resistance 1 according to an embodiment of the present invention, and FIG. 1 (b) is a front view showing the heating resistance 1. Further, FIG. 2 (a) is a plan view showing a heating resistance 1A according to another embodiment, and FIG. 2 (b) is a front view showing the heating resistance 1A.

FIG. 1 shows a heating resistance 1 composed of a band 5 made of a conductive material. The band 5 is elongated horizontally in FIG. 1 to form a band, tape, or cord-shaped body. Many folds 2 extending in a direction perpendicular to the longitudinal direction of the heating resistance 1 are formed in the resistance 1 at a predetermined interval. A pair of wall parts 3a and 3b are formed on the both sides of the fold 2. A pair of wall parts 3a and 3b constitute one repetition unit 3. Further, "λ" represents a length (pitch) of one repetition unit 3, "B" represents an amplitude of the repetition unit 3, and "W" represents a width of the band 5.

Figure 2:
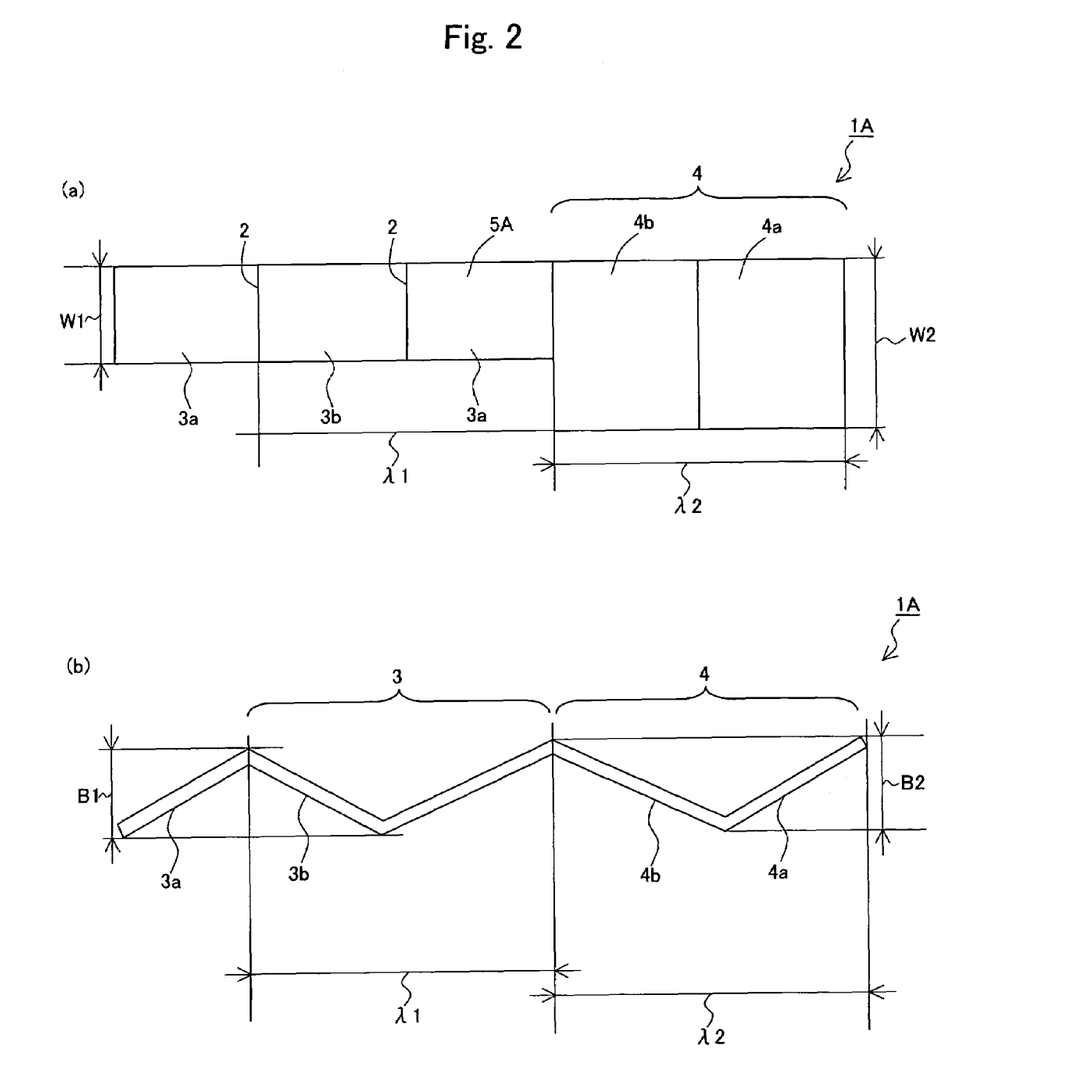

FIG. 2 shows a heating resistance 1A composed of a band 5A made of a conductive material. The band 5A is elongated horizontally in FIG. 2 to form a band, tape, or cord-shaped body. Many folds 2 extending in a direction perpendicular to the longitudinal direction of the heating resistance 1A are formed in the resistance 1A at a predetermined interval. A pair of wall parts 3a and 3b, or 4a and 4b, are formed on the both sides of the fold 2. A pair of wall parts 3a and 3b constitute one repetition unit 3, and a pair of wall parts 4a and 4b constitute one repetition unit 4. The repetition units 3 and 4 are continuously formed in one integrated band 5A.

"λ1" represents a length (pitch) of the repetition unit 3, "B1" represents an amplitude of the repetition unit 3, and "W1" represent a width of the band in the repetition unit 3. Further, "λ2" represents a length (pitch) of the repetition unit 4, "B2" represents an amplitude of the repetition unit 4, and "W2" represents a width of the band in the repetition unit 4. According to the present example, the amplitudes "B1" and "B2" are the same and the pitches "λ1" and "λ2" are the same in repetition units 3 and 4. The width "W2" of repetition unit 4 is, however, made larger than the width "W1" of repetition unit 3. The heating value per unit length in repetition unit 4 is smaller than that in repetition unit 3 when power is supplied to the heating resistance 1A in the longitudinal direction.

As can be seen from the examples shown in FIGS. 1 and 2, in the heating resistance according to the present invention, the pitches "λ," "λ1," "λ2," amplitudes "B," "B1," "B2," and widths "W," "W1," and "W2" in repetition units 3 and 4 can be changed relatively easily and can be designed and manufactured with high precision. It is thus possible to appropriately adjust the heating value per unit length in any part of the heating resistance. For example, in each part of the heating resistance, the pitch "λ" of the repetition units can be easily controlled by changing the position of the fold 2 and the angles of inclination of the wall parts 3a, 3b, 4a and 4b. Further, the amplitudes in the repetition units can be easily controlled by changing the position of the fold 2 and the angles of inclination of the wall parts 3a, 3b, 4a and 4b. Further, the widths of the band can be easily adjusted by adjusting the width of the band when the band is produced. When the pitch, amplitude or width of the band of the heating resistance is changed, the band is continuous at the interface where the pitch, amplitude or width is changed to prevent the risk of abnormal heat generation and disconnection. Further, the troublesome connecting process described earlier is not necessary for production.

Figure 3:
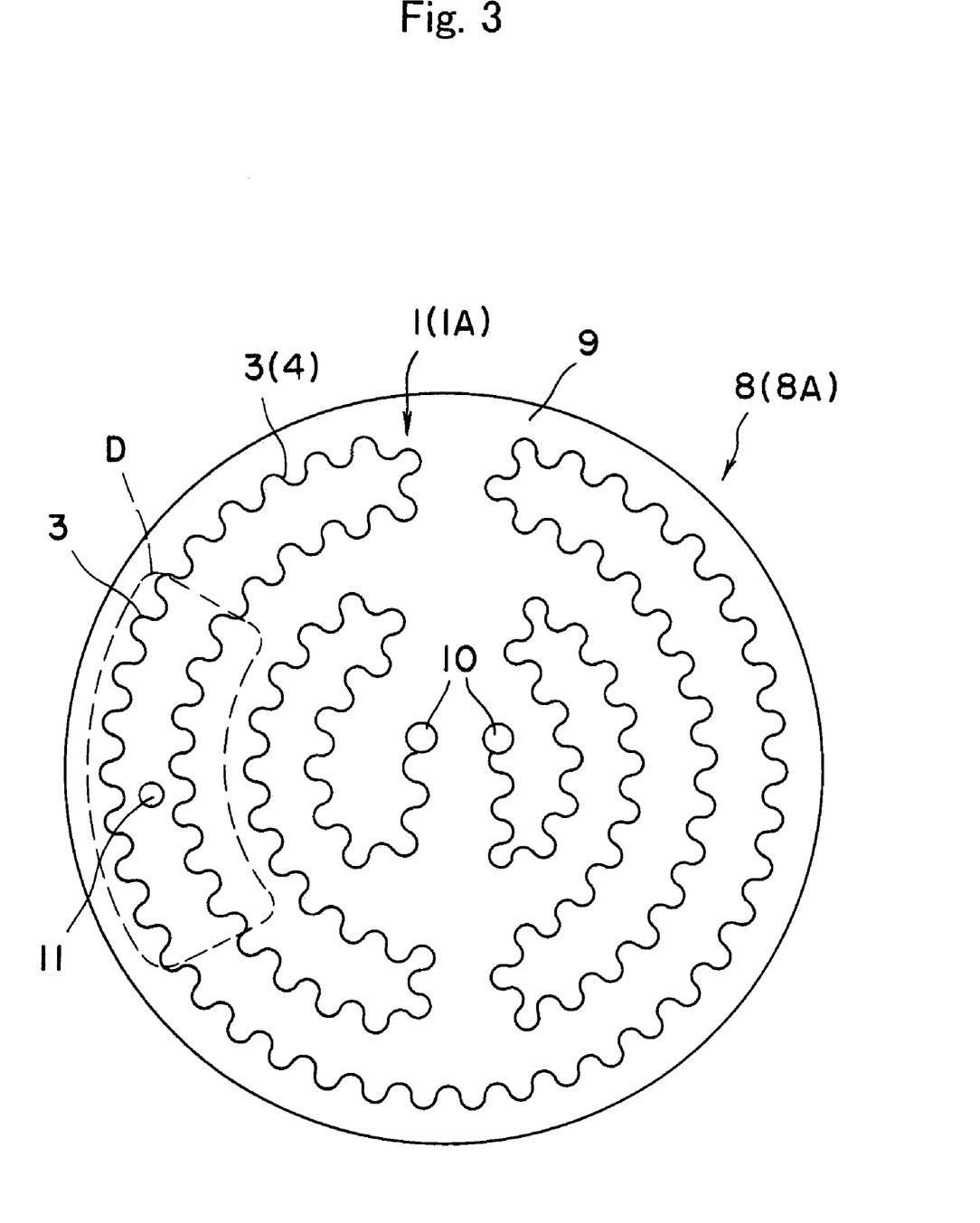
FIG. 3 is plan view showing an example of planar pattern of the heating resistance 1 (1A) of a heater 8 (8A).

FIG. 3 is a plan view showing an example of a planar pattern of the heating resistance 1 (or 1A) in a substrate 9 of a heater 8 (or 8A) according to one embodiment of the first aspect of the present invention. Although the substrate 9 substantially has a shape of a disk according to the present example, the shape of the substrate 9 is not particularly limited. Further, although the heating resistance 1 (1A) can be provided on the upper and lower surface of the substrate 9, the heating resistance 1 (1A) is preferably embedded in the substrate 9. When the heating resistance 1 (1A) is embedded in the substrate 9, FIG. 3 schematically shows the planar pattern of the embedded heating resistance as a perspective projection.

For example, a pair of terminals 10 are embedded in a central part of the substrate 9 and are electrically and mechanically connected with respective outer power supply cables (not shown). The heating resistance 1 or 1A having the shape described above is connected to a pair of terminals 10. The heating resistance is positioned according to a predetermined spiral pattern so that the heating resistance surrounds the terminals 10.

Figure 4:
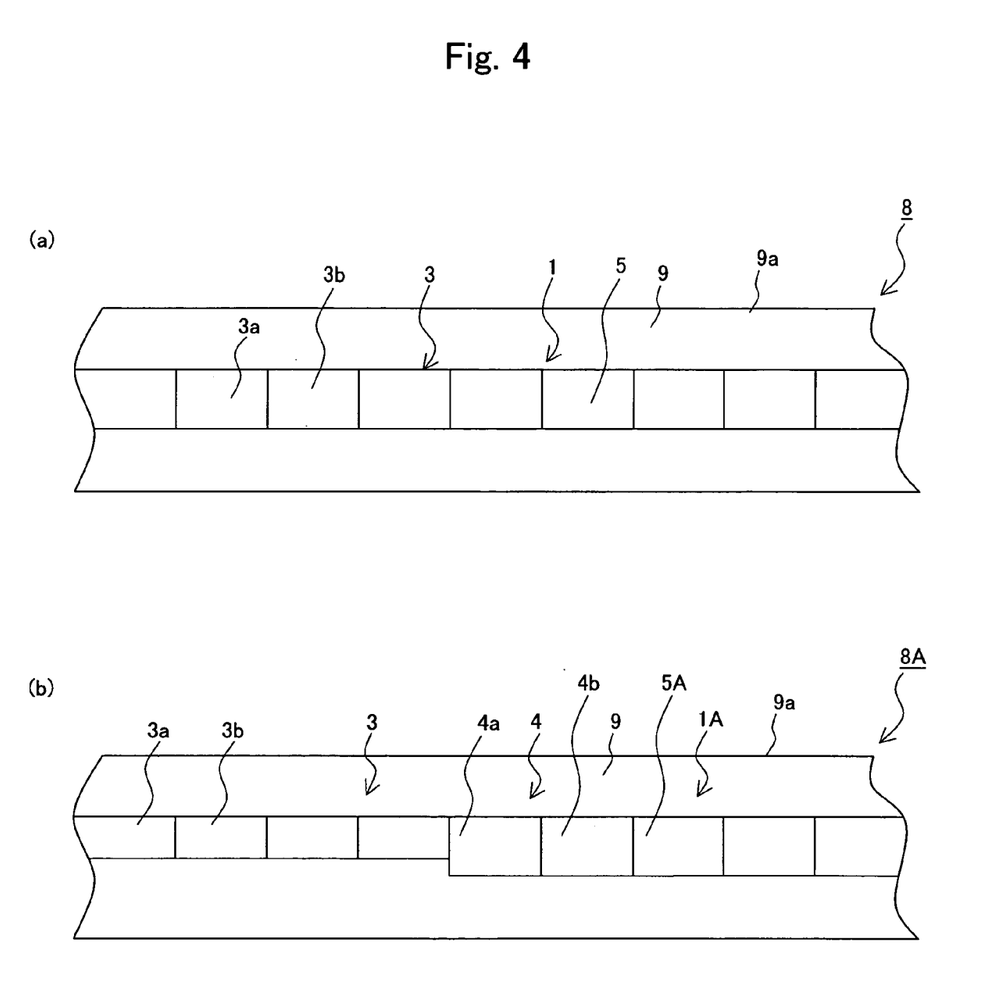

For example, as schematically shown in FIG. 4 (a), the pitch "λ," amplitude "B" and width "W" can be made constant over the whole length of the heating resistance 1. In this case, the heating value per unit length of the heating resistance can be made to be substantially constant over the whole length. If the desired temperature distribution on the surface of the substrate 9 can be attained by this kind of design, it is not needed to consider another design type.

Depending on the design of the heater, however, it may be necessary to increase the heating value in one part of the heating resistance compared to another part of the heating resistance. In the example shown in FIG. 3, a through hole 11 is formed near the outer periphery of the substrate 9. In this case, it is difficult to embed the heating resistance 1 (heat source) in the proximity of the through hole 11 and calorific energy escapes from the inner wall surface of the through hole 11. The temperature tends to be locally lowered in a region near the through hole 11 in the substrate 9. In this case, as shown in FIG. 4 (b), the repetition units 3 having a smaller width are embedded in a specific region "D" near the through hole 11, and the repetition units 4 having a larger width are embedded in the other region. As a result, the heating value per unit length is made relatively larger in the specific region "D" to supply an excessive calorific energy to the surface of the substrate 9 sufficient to compensate for the absence of the heating resistance near the through hole 11 and the escape of heat from the inner wall surface of the through hole 11.

A second aspect of the present invention provides a heating resistance comprising a wound body of a band composed of a conductive material. The second aspect of the present invention further provides a heater comprising a substrate made of an insulating material and the above heating resistance fixed to the substrate.

Figure 5:
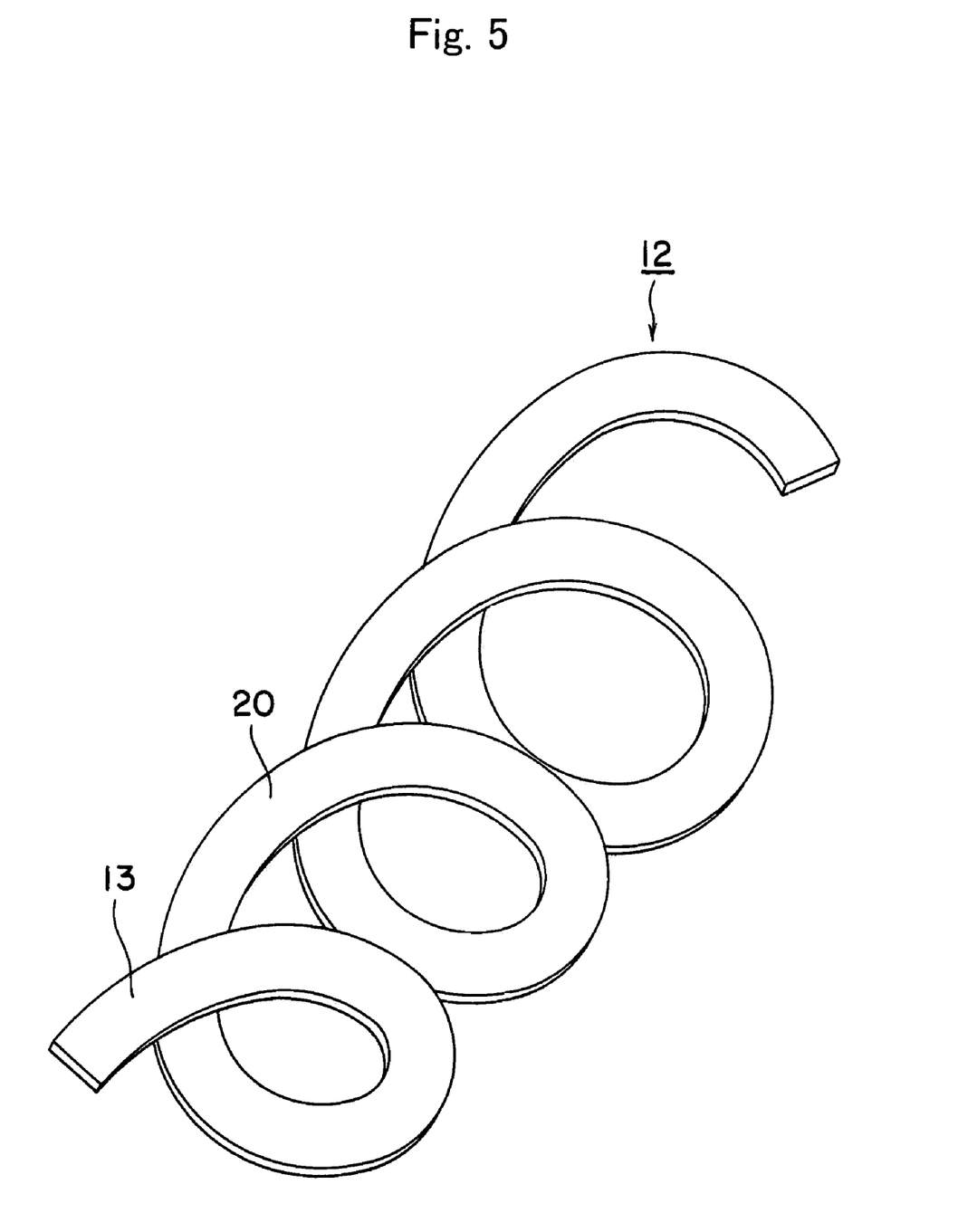
FIG. 5 is a perspective view showing a heating resistance 12 according to a second embodiment of the present invention.

The advantageous effects will be described referring to FIGS. 5 to 7. FIG. 5 is a perspective view showing a heating resistance 12 according to an embodiment of the present invention, and FIGS. 6 and 7 are plan views showing heating resistances 12 and 12A, respectively.

Figure 6:
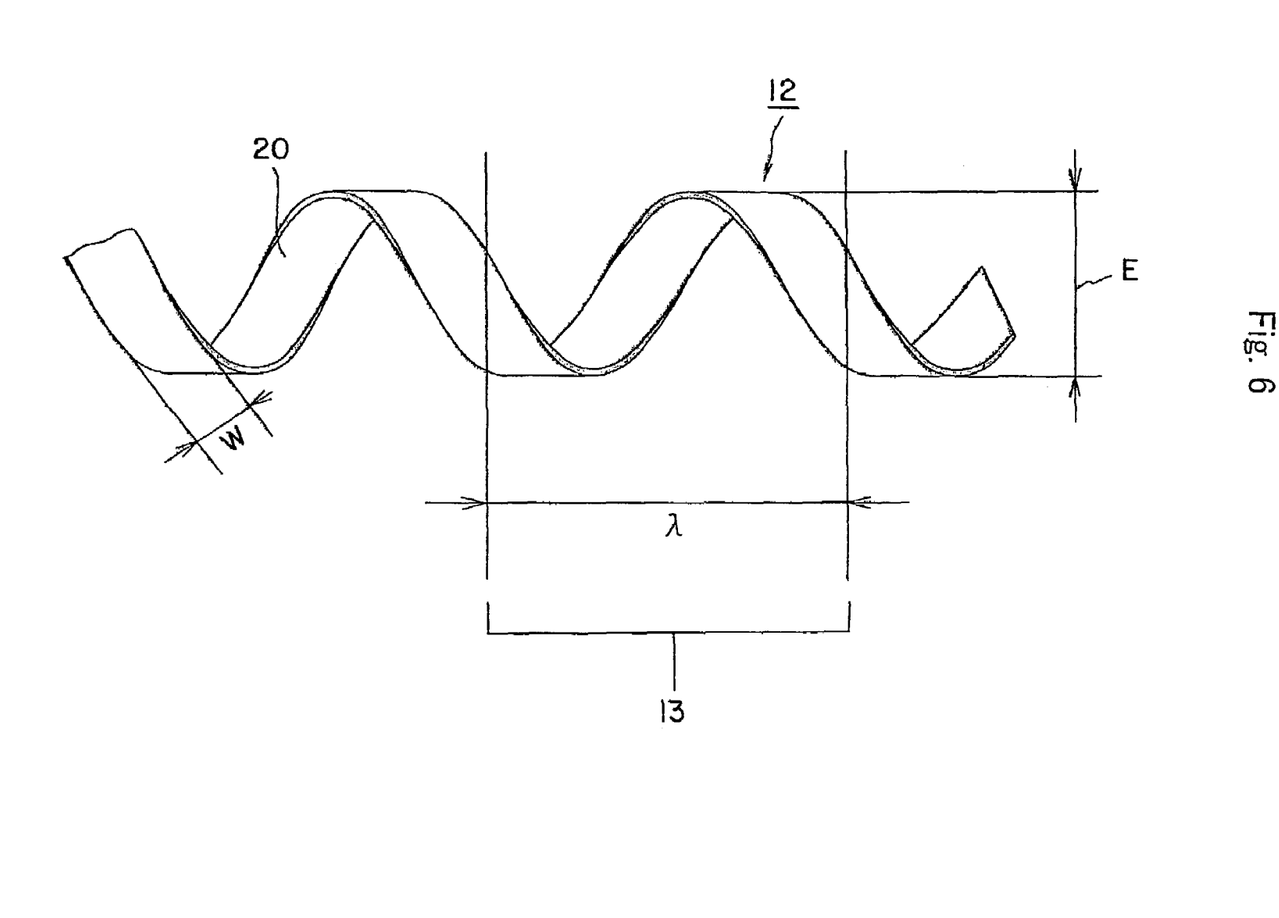
FIG. 6 is a front view showing a heating resistance 12.

The heating resistance 12 of FIGS. 5 and 6 is composed of a band 20 made of a conductive material. The band 20 is wound to a shape of a spiral or coil spring to form a heating resistance 12. In FIG. 6, "$\lambda$" represents a length (pitch) of one repetition unit 13 of the spiral, "E" represents the winding diameter (coil diameter) of the spiral, and "W" represents the width of the band 20.

Figure 7:
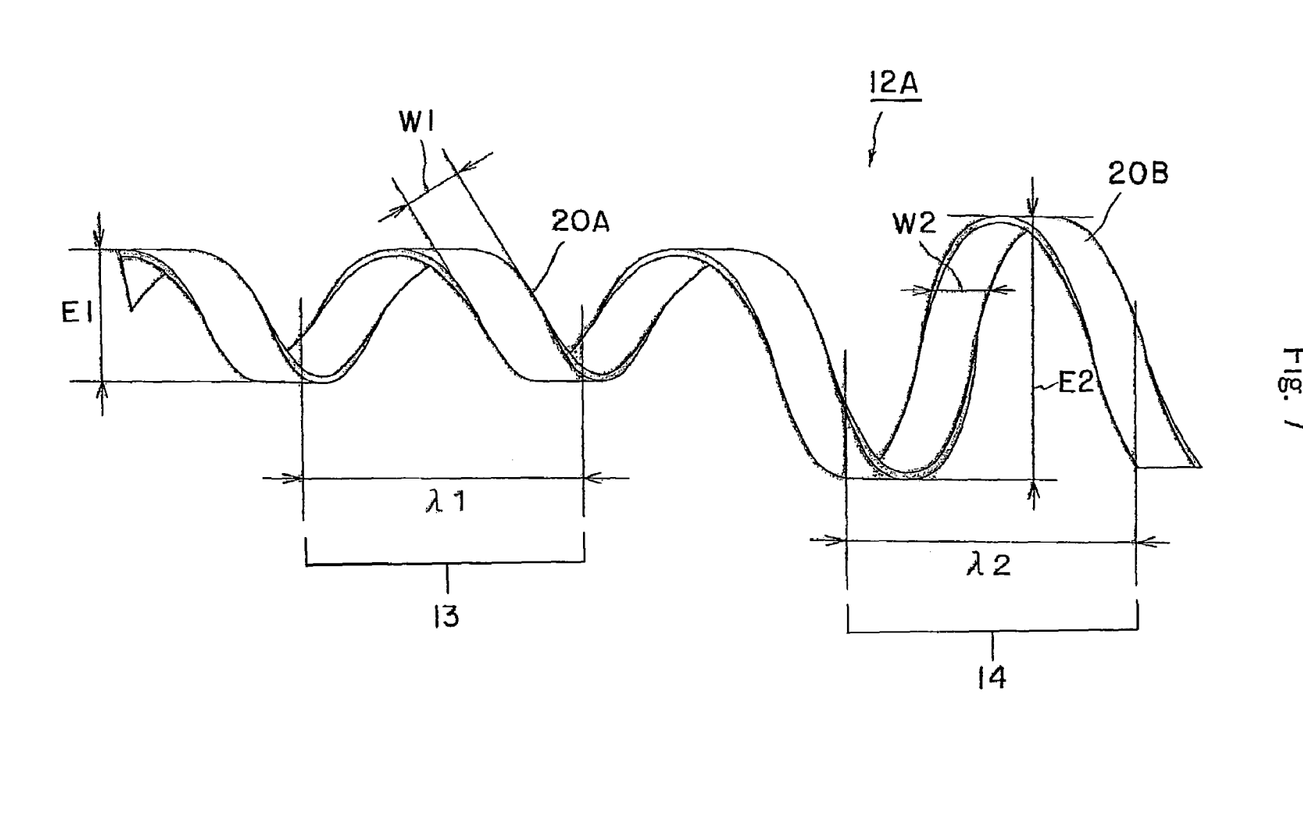
FIG. 7 is a front view showing a heating resistance 12A.

In FIG. 7, bands 20A and 20B having widths "W1" and "W2" are shaped to provide an integral and elongate body. "$\lambda 1$" represents a length "pitch" of one repetition unit 13 of the spiral, "E1" represents a winding diameter of the spiral, and "W1" represents the width of the band 13. Further, "$\lambda 2$" represents a length (pitch) of one repetition unit 14, "E2" represents the winding diameter of the spiral, and "W2" represents the width of the band 14.

According to the present example, the pitches $\lambda 1$ and $\lambda 2$ of the spiral are the same and the widths "W1" and "W2" of the bands 20A and 20B are the same in the repetition units 13 and 14. The winding diameter "E2" of the repetition unit 14 is, however, made larger than the winding diameter "E1" of the repetition unit 13. The heating value per a unit length of the heating resistance in the repetition unit 14 is made larger than that in the repetition unit 13 when power is supplied to the heating resistance 12A in the longitudinal direction.

Alternatively, the winding diameters and pitches can be made different in the repetition units 13 and 14. In this case, the width "W1" (repetition unit 13) of the band 20A is made larger than the width "W2" (repetition unit 14) of the band 20B. The heating value per a unit length of the heating resistance in the repetition unit 14 is thus made larger than that in the repetition unit 13.

Alternatively, the widths and winding diameters can be made different in the repetition units 13 and 14. In this case, the pitch "$\lambda 1$" (repetition unit 13) of the band 20A is made larger than the pitch "$\lambda 2$" (repetition unit 14) of the band 20B. The heating value per a unit length of the heating resistance in the repetition unit 14 is thus made larger than that in the repetition unit 13.

As can be seen from the examples shown in FIGS. 5 to 7, according to the heating resistance of the present invention, the pitches "$\lambda$", "$\lambda 1$" and "$\lambda 2$" and winding diameters "E1" and "E2" of spiral and the widths "W", "W1" and "W2" of the band in the repetition units 13 and 14 can be changed relatively easily and designed and manufactured at a high precision. It is thus possible to appropriately adjust the heating value per a unit length in any part of the heating resistance. When the pitch, winding diameter and width of the heating resistance is changed in the band, the band is continuous at interface where the pitch, winding diameter or width is changed to prevent the risk of abnormal heat generation and disconnection. Further, the troublesome connecting process described earlier is not necessary for the production.

Figure 8:
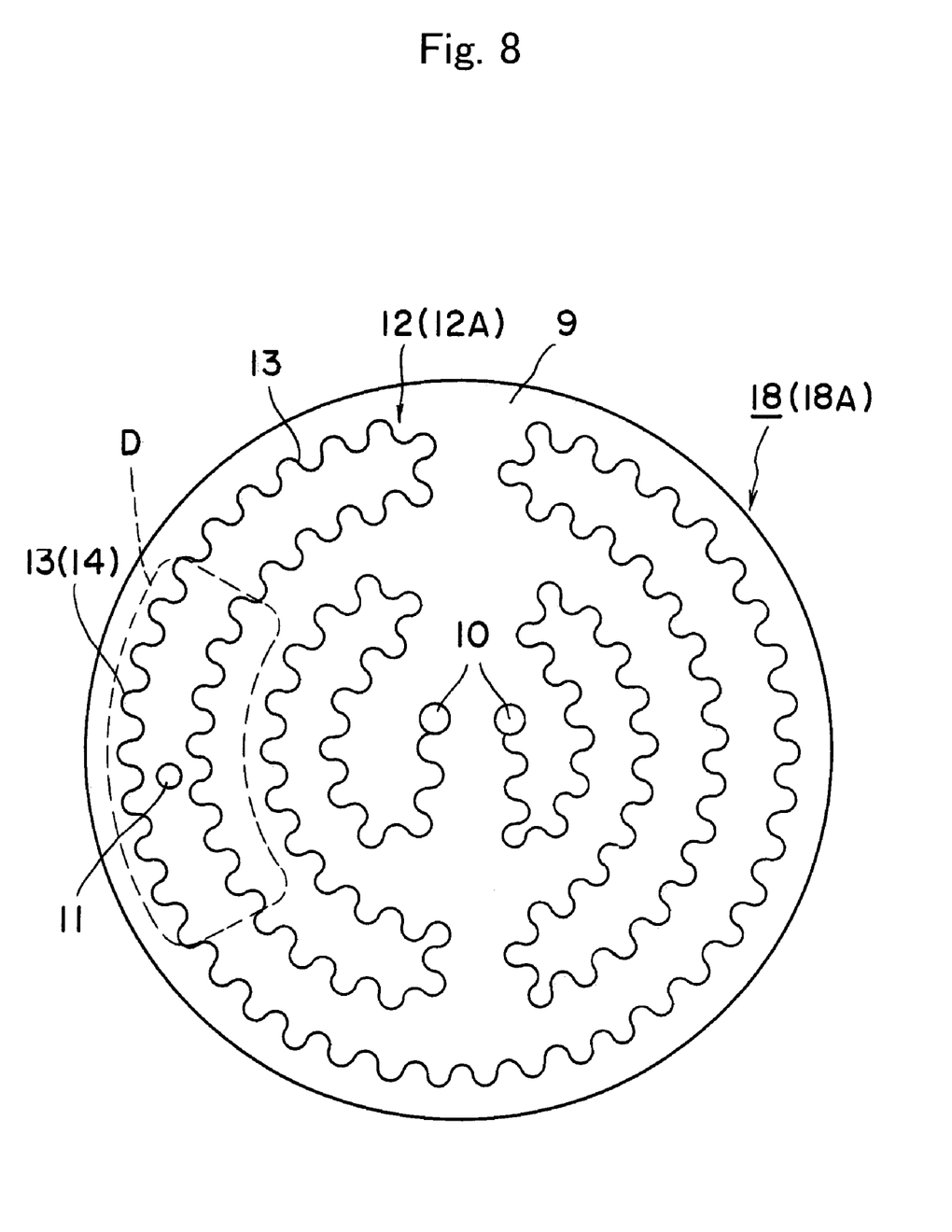
FIG. 8 is a plan view showing an example of planar pattern of the heating resistance 12 (12A) in a heater 18 (18A).

FIG. 8 is a plan view showing an example of planar pattern of the heating resistance 12 (or 12A) in a substrate 9 of a heater 18 (or 18A) according to one embodiment of the second aspect of the present invention. Although the heating resistance 12 (12A) may be provided on the upper and lower surfaces of the substrate 9, the heating resistance 12 (12A) may preferably be embedded in the substrate 9. When the heating resistance 12 (12A) is embedded in the substrate 9, FIG. 8 schematically shows the planar pattern of the embedded heating resistance as a perspective projection.

The planar patterns of the embedded heating resistances 12 and 12A are the same as that shown in FIG. 3, and further explanation is omitted. According to the present example, as shown in FIG. 6, the pitch "$\lambda$", winding diameter "E" and width "W" can be made substantially constant over the whole length of the heating resistance. In this case, the heating value per a unit length of the heating resistance can be made substantially constant over the whole length of the heating resistance.

Depending on the design of the heater, however, it may be required that the heating value is made larger in one part of the heating resistance than in another part of the resistance. In the example of FIG. 8, it is provided that a through hole 11 is formed near the outer periphery of the substrate 9. In this case, the temperature tends to be locally lowered in a region near the through hole 11 in the substrate 9. In this case, as shown in FIG. 7, the repetition units 14 having a larger winding diameter "E2" is embedded in a specific region "D" near the through hole 11, and the repetition units 13 having a smaller winding diameter "E1" are embedded in the other region. As a result, the heating value per a unit length is made relatively larger in the specific region "D" to supply an excessive calorific energy to the surface of the substrate 9 sufficient to compensate for the absence of the heating resistance near the through hole 11 and the escape of heat from the wall inner surface the through hole 11.

In the first and second aspects of the present invention, the kind of object to be heated is not limited. Further, the application of the heating resistance and heater according to the present invention is not particularly limited, and may preferably a system for producing semiconductors. Such system means a system usable in a wide variety of semiconductor processing in which metal contamination of a semiconductor is to be avoided. Such system includes a film forming, etching, cleaning and testing systems.

The material for the heating resistance is preferably tantalum, tungsten, molybdenum, platinum, rhenium, hafnium or the alloys of these metals. In particular, when the ceramic substrate is made of aluminum nitride, the material of the heating resistance is preferably pure molybdenum or an alloy containing molybdenum. The material of the heating resistance may be a conductive material such as carbon, TiN or TiC, in addition to the high melting point metals described above.

The materials that can be used for the substrate of the heater include a ceramic material or other insulating materials, and are not particularly limited. The material for the substrate may be a known ceramic material including a nitride ceramics such as aluminum nitride, silicon nitride, boron nitride and sialon, and an alumina-silicon carbide composite material. Aluminum nitride or alumina is most preferred for providing an excellent anti-corrosion property against a corrosive gas such as a halogen based corrosive gas.

The shape of the substrate is not particularly limited and may preferably be a disk. Pocket shaped parts, emboss-shaped parts, or grooves may be formed on the heating face.

According to the first and second aspects of the present invention, the thickness of the band is not particularly limited. The thickness is preferably 0.05 mm or larger for preventing the disconnection of the heating resistance. Further, the thickness is preferably 5 mm or smaller from the viewpoint of easily deforming the band to a shape of spiral or bellows.

Further, in the first and second aspects of the present invention, a through hole may be formed in the band. It is possible to control the heating value generated from any part of the heating resistance, by controlling the shape, dimension and number of the through hole. Further, when the wave shaped body or wound body composed of a band having a through holes formed therein is embedded in an insulating substrate, it is possible to improve the adhesion of the insulating material, particularly ceramics, constituting the substrate.

Figure 9:
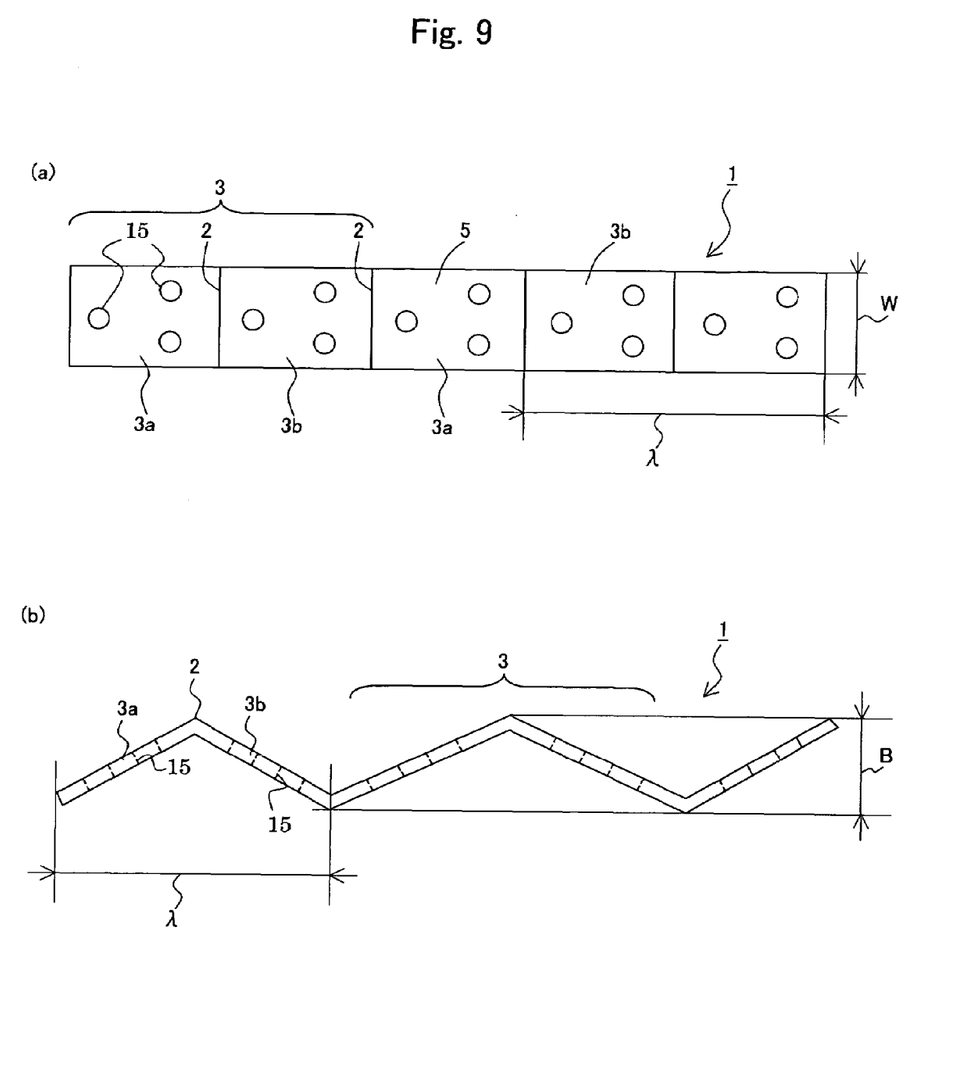
FIG. 9(a) is a plan view showing a heating resistance 1 with a through hole 15 formed therein.
FIG. 9(b) is a front view showing the heating resistance 1 of FIG. 9(a).
Figure 10:
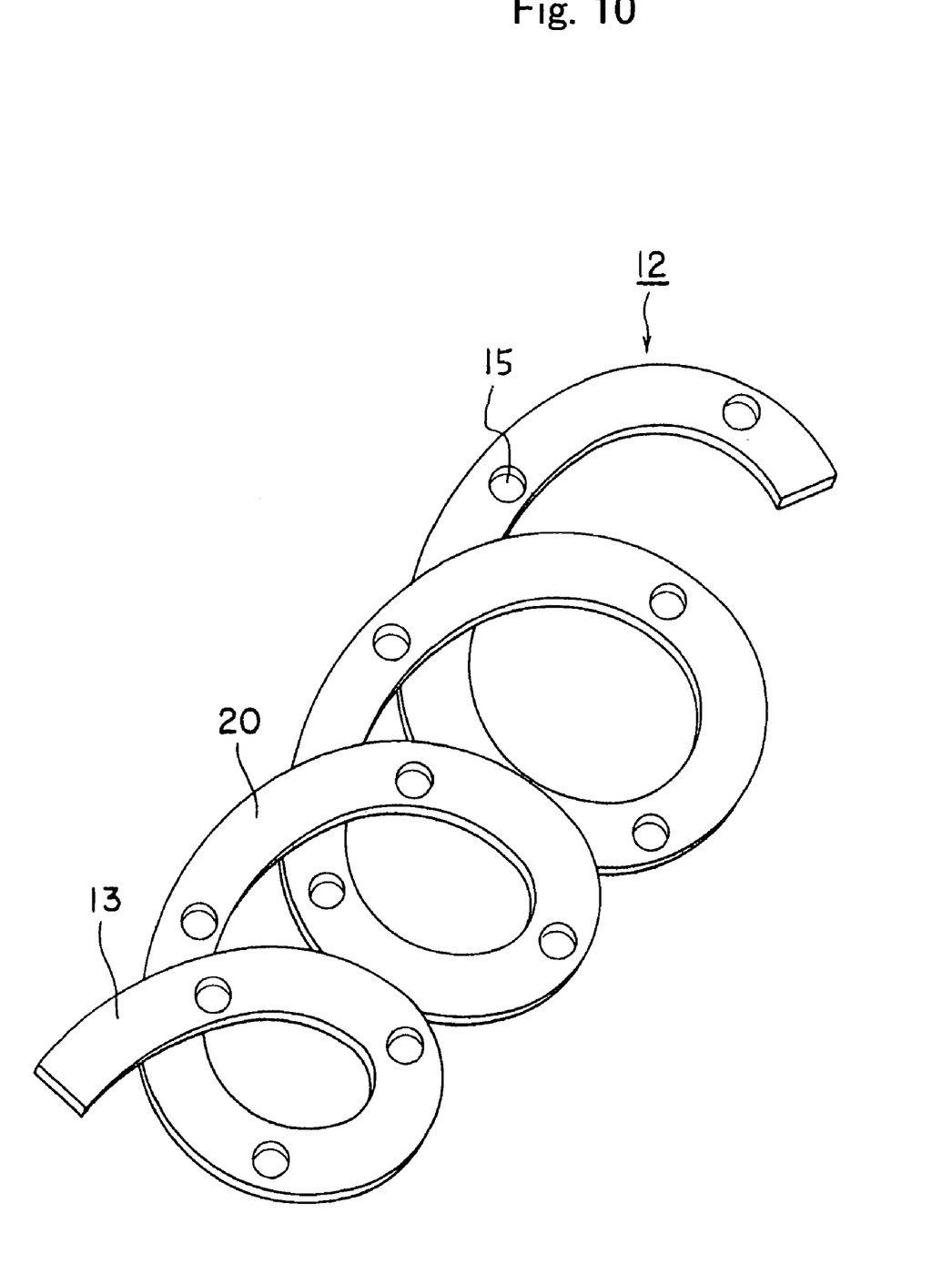
FIG. 10 is a perspective view showing a heating resistance 12 with a through hole formed therein.

FIG. 9 (a) is a front view showing a heating resistance 1 according to this embodiment, and FIG. 9 (b) is a plan view showing the heating resistance 1. According to the present example, many through holes 15 are formed in the band 5 at predetermined intervals. Further, FIG. 10 is a perspective view showing a heating resistance 12 according to the present embodiment. Many through holes 15 are formed in the band 20 at predetermined intervals.

EXAMPLES

Example 1

The heater 8 described referring to FIGS. 3 and 4 (a) was produced and the temperature distribution on the surface 9a was measured.

Specifically, the substrate 9 was made of aluminum nitride sintered body having a diameter φ of 350 mm and a thickness of 20 mm. The heating resistance 1 shown in FIGS. 1 (a) and 1 (b) was embedded in the substrate 9. The band 1 was formed of molybdenum and had a thickness of 0.2 mm and width "W" of 10 mm. The pitch "λ" of the repetition unit 3 was 1 to 7 mm and the amplitude "B" of the repetition unit 3 was 3 mm.

Figure 11:
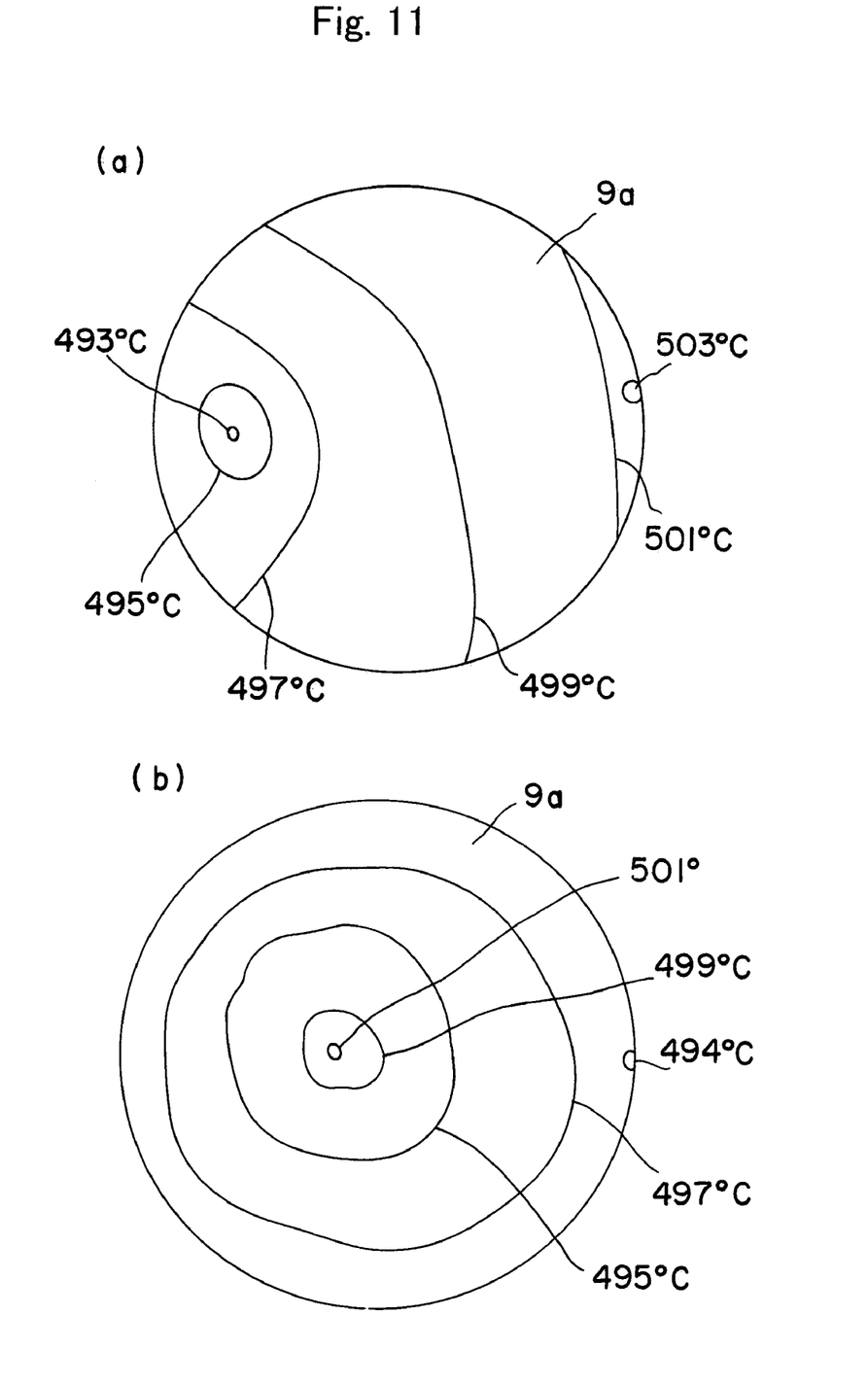
FIG. 11(a) is a diagram showing contour lines of temperature on the surface of the heater.
FIG. 11(b) is a diagram showing contour lines of temperature on the surface of the heater.

The temperature of the ceramic heater was raised so that the average temperature on the surface 9a reached about 500° C. The temperature distribution on the surface 9a was observed with a thermoviewer. FIG. 11 (a) shows the thus obtained contour lines of temperature. The minimum temperature point of 493° C. was near the through holes 11. The maximum temperature point of 503° C. was on the outer periphery on the opposite side to the through hole 11. The difference of the maximum and minimum temperatures was 10° C. to prove that the temperature uniformity on the surface can be considerably improved.

Example 2

The heater 8A described referring to FIGS. 3 and 4 (b) was produced and the temperature distribution on the surface 9a was measured.

The heating resistance 1A shown in FIGS. 2 (a) and 2 (b) was embedded in the substrate 9. The band 5A was formed of molybdenum and had a thickness of 0.2 mm. The width "W1" was 7 mm, pitch "λ1" was 1 to 7 mm and amplitude "B1" was 3 mm in the repetition unit 3. The width "W2" was 10 mm which was larger than W1, pitch "λ2" was 1 to 7 mm and amplitude "B2" was 3 mm in the repetition unit 4.

The temperature of the ceramic heater was raised so that the average temperature on the surface 9a reached about 500° C. The temperature distribution on the surface 9a was observed with a thermoviewer. FIG. 11 (b) shows the thus obtained contour lines of temperature. The minimum temperature point of 494° C. was observed at the outer periphery. The maximum temperature point of 501° C. was near the center of the surface 9a. The difference of the maximum and minimum temperatures was 7° C. to prove that the temperature uniformity on the surface can be considerably improved.

Example 3

The heater 18 described referring to FIGS. 6 and 8 was produced and the temperature distribution on the surface 9a was measured.

Specifically, the substrate 9 was made of aluminum nitride sintered body had a diameter φ of 350 mm and a thickness of 20 mm. The heating resistance 12 shown in FIG. 6 was embedded in the substrate 9. The band 20 was formed of molybdenum and had a thickness of 0.2 mm and a width "W" of 10 mm. The pitch "λ" was 1 to 7 mm the winding diameter "E" was 4 mm in the repetition unit 13.

The temperature of the ceramic heater was raised so that the average temperature on the surface 9a reached about 500° C. The temperature distribution on the surface 9a was observed with a thermoviewer. The difference of the maximum and minimum temperatures was 8° C. to prove that the temperature uniformity on the surface can be considerably improved.

Example 4

The heater 18A described referring to FIGS. 7 and 8 was produced and the temperature distribution on the surface 9a was measured.

The heating resistance 12A shown in FIG. 7 was embedded in the substrate 9. The bands 20A and 20B were formed of molybdenum and had a thickness of 0.1 mm. The thickness "W1" was 10 mm, the pitch "λ1" was 1 to 7 mm and winding diameter "E1" was 4 mm in the repetition unit 13. The thickness "W2" was reduced to 7 mm, the pitch "λ2" was 1 to 7 mm and winding diameter "E2" was 4 mm and the same as "E1" in the repetition unit 14.

The temperature of the ceramic heater was raised so that the average temperature on the surface 9a reached about 500° C. The temperature distribution on the surface 9a was observed with a thermoviewer. The difference of the maximum and minimum temperatures was 5° C. to prove that the temperature uniformity on the surface can be considerably improved.

As described above, the present invention provides a heating resistance so that the heating value per a unit length can be easily designed and changed, and the reliability can be improved and abnormal heat generating can be prevented at the interface where the heating value per a unit length is changed.

The present invention has been explained referring to the preferred embodiments. However, the present invention is not limited to the illustrated embodiments which are given by way of examples only, and may be carried out in various modes without departing from the scope of the invention.

The invention claimed is:

1. A heater comprising:

an insulating substrate having an outer heating face for mounting a semiconductor, said outer heating face defining a main plane of said insulating substrate, and said insulating substrate having a thickness direction extending perpendicular to said main plane; and a heating resistance entirely embedded within said insulating substrate so that said heating resistance is not exposed to said outer heating face or any other outer surface of said insulating substrate, said heating resistance comprising a wave-shaped body made of a conductive band, said wave-shaped body having a plurality of portions, wherein a width of at least one of said portions is different from that of another one of said portions, and wherein said width of said portions extends in said thickness direction of said insulating substrate.

2. The heater of claim 1, wherein said conductive band includes a through hole formed therein.

3. The heater of claim 1, wherein said wave-shaped body comprises a plurality of plate-shaped sections and a plurality of folded parts situated between said plate-shaped sections and defining a plurality of repetition units, wherein each said repetition unit corresponds to one of said plurality of portions of said wave-shaped body, and wherein each said repetition unit comprises a pair of said plate-shaped sections having one of said folded parts interposed therebetween.

* * * * *